(12) United States Patent
Oh et al.

(10) Patent No.: US 8,956,970 B1
(45) Date of Patent: Feb. 17, 2015

(54) METHOD OF FORMING SEMICONDUCTOR DEVICE HAVING MULTILAYERED PLUG AND RELATED DEVICE

(71) Applicant: Samsung Electronics Co., Ltd., Gyeonggi-do (KR)

(72) Inventors: Hyoung-Won Oh, Gyeonggi-do (KR); Tae-Jin Lim, Gyeonggi-do (KR); Tae-Ki Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/200,798

(22) Filed: Mar. 7, 2014

(30) Foreign Application Priority Data

Aug. 13, 2013 (KR) .................. 10-2013-0096010

(51) Int. Cl.
*H01L 21/4763* (2006.01)
*H01L 21/768* (2006.01)

(52) U.S. Cl.
CPC .............................. *H01L 21/76879* (2013.01)
USPC ......................... 438/638; 438/597; 438/637

(58) Field of Classification Search
None
See application file for complete search history.

(56) References Cited

U.S. PATENT DOCUMENTS

| | | | |
|---|---|---|---|
| 7,351,633 B2 | 4/2008 | Kim | |
| 7,517,771 B2 | 4/2009 | Shibata et al. | |
| 2005/0245073 A1 | 11/2005 | Lee et al. | |
| 2008/0286957 A1* | 11/2008 | Lee et al. | 438/607 |
| 2012/0077319 A1 | 3/2012 | Lee et al. | |

FOREIGN PATENT DOCUMENTS

KR   1020040001015   1/2004

OTHER PUBLICATIONS

"Very-Low-Temperature Silicon Epitaxy by Plasma-CVD Using SiH4-PH3-H2 Reactants for Bipolar Devices" issued on vol. 27, No. 4, pp. L493-L495 on Japanese Journal of Applied Physics in Apr. 1988.
"In Situ Doped Si Selective Epitaxal Growth at Low Temperatures by Atmospheric Pressure Plasma CVD" issued on The Electrochemical Society in 2009.

* cited by examiner

*Primary Examiner* — Jack Chen
(74) *Attorney, Agent, or Firm* — F. Chau & Associates, LLC

(57) ABSTRACT

A semiconductor pattern is formed on a substrate. An interlayer insulating layer is formed on the semiconductor pattern. A contact hole in the interlayer insulating layer is formed the semiconductor pattern is exposed. A lower plug is formed in the contact hole by a selective epitaxial growth (SEG) process. An upper plug is farmed in the contact hole on the lower plug by alternately and repeatedly performing a deposition process and an etching process.

15 Claims, 17 Drawing Sheets

1

METHOD OF FORMING SEMICONDUCTOR DEVICE HAVING MULTILAYERED PLUG AND RELATED DEVICE

CROSS-REFERENCE TO RELATED APPLICATION

This application claims priority under 35 U.S.C. §119 to Korean Patent Application No. 10-2013-0096010 filed on Aug. 13, 2013, the disclosure of which is incorporated by reference herein in its entirety.

1. Technical Field

Exemplary embodiments of the present inventive concept relate to a method of forming a semiconductor device, and more particularly to a semiconductor device having a multi-layered plug.

2. Discussion of Related Art

In a semiconductor device having diverse and complex intermediate interconnections, various methods may be used to form a contact plug bypassing intermediate interconnections.

SUMMARY

Exemplary embodiments of the present inventive concept provide a method of forming a semiconductor device having a contact plug bypassing intermediate interconnections.

Exemplary embodiments of the present inventive concept provide a semiconductor device having a contact plug bypassing intermediate interconnections.

Exemplary embodiments of the present inventive concept provide a semiconductor manufacturing apparatus for forming a semiconductor device having a contact plug bypassing intermediate interconnections.

The technical objectives of the present inventive concept are not limited to the present disclosure. Other aspects of the present inventive concept may become apparent to those of ordinary skill in the art based on the following descriptions.

In accordance with an exemplary embodiment of the present inventive concept, a method of forming a semiconductor device includes forming a semiconductor pattern on a substrate. An interlayer insulating layer is formed on the semiconductor pattern. A contact hole exposing the semiconductor pattern is formed in the interlayer insulating layer. A lower plug is formed in the contact hole using a selective epitaxial growth (SEG) process. An upper plug is formed in the contact hole on the lower plug by alternately and repeatedly performing a deposition process.

In some embodiments, the contact hole may include an upper contact hole having a height greater than a width, and a lower contact hole connected to a lower part of the upper contact hole and exposing the semiconductor pattern. A center of the upper contact hole may be offset from a center of the semiconductor pattern.

In some embodiments, the contact hole may have an "L" shape.

In some embodiments, the lower contact hole may have a width greater than a height thereof.

In some embodiments, the SEG process, the deposition process, and the etching process may be performed in the same chamber by an in-situ process.

In some embodiments, the etching process may be performed before the deposition process.

In some embodiments, a lower end of the upper plug may be formed at a lower level than an upper end of the lower plug. The upper end of the lower plug may protrude up along an edge of the upper plug.

2

In accordance with an exemplary embodiment of the present inventive concept, a method of forming a semiconductor device includes forming a drain area on a substrate. An interlayer insulating layer is formed on the drain area. A contact hole exposing the drain area is formed in the interlayer insulating layer. A selective epitaxial growth (SEG) plug is formed in the lower contact hole using a selective epitaxial growth (SEG) process. A polysilicon plug is formed in the contact hole on the SEG plug by alternately and repeatedly performing a deposition process. In some embodiments, a center of the polysilicon plug may be offset from a center of the drain area.

In some embodiments, the semiconductor device may include a contact plug including the polysilicon plug and the SEG plug. The contact plug may have an "L" shape.

In some embodiments, the center of the SEG plug may be offset from the center of the drain area. The SEG plug may have a width greater than a height.

Details of embodiments are included in the detailed description and drawings.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

Figure 1:
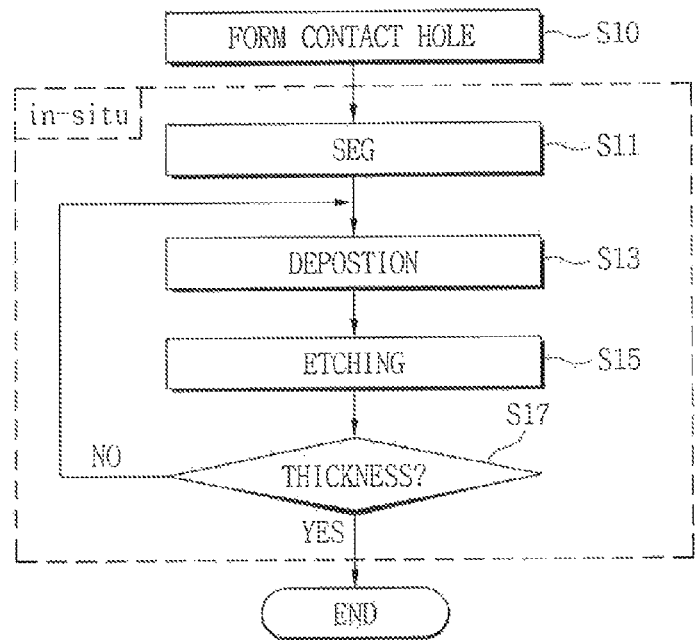
FIGS. 1 and 2 are flowcharts illustrating methods of forming a semiconductor device in accordance with exemplary embodiments of the present inventive concept.

Exemplary embodiments of the present inventive concept will now be further described with reference to the accompanying drawings in which exemplary embodiments are shown. The present inventive concept may, however, be embodied in different forms and should not be construed as limited to the embodiments set forth herein. In the drawings, the sizes and relative sizes of layers and regions may be exaggerated for clarity.

The terminology used herein to describe embodiments of the inventive concept is not intended to limit the scope of the invention. Elements of the inventive concept referred to in the singular may number one or more, unless the context clearly indicates otherwise. It will be understood that when an element is referred to as being "connected" or "coupled" to another element, it may be directly connected or coupled to the other element or intervening elements may be present. In contrast, when an element is referred to as being "directly connected" or "directly coupled" to another element, there might not be any intervening elements.

Terms such as "beneath," "below," "lower," "above," "upper" and the like may be used herein to describe the relationship of one element or feature to another, as illustrated in the drawings. It will be understood that such descriptions may be intended to encompass different orientations in use or operation in addition to orientations depicted in the drawings. For example, if a device is turned over, elements described as "below" or "beneath" other elements or features would then be oriented "above" the other elements or features.

Exemplary embodiments may be described herein with reference to cross-sectional illustrations that are schematic illustrations of idealized embodiments (and intermediate structures). Variations from the shapes of the illustrations as a result, for example, of manufacturing techniques and/or tolerances, may occur. Thus, embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted into non-implanted region.

It will he understood that, although the terms first, second, A, B, etc. may be used herein in reference to elements of the inventive concept, such elements should not be construed as limited by these terms. For example, a first element could be termed a second element, and a second element could be termed a first element, without departing from the scope of the present inventive concept.

Terms such as "front side" and "back side" may be used in a relative sense herein to facilitate further understanding of the inventive concept. Accordingly, "front side" and "back side" need not refer to any specific direction, location, or component, and may be used interchangeably. For example, "front side" may be interpreted as "back side" and vice versa. Also, "front side" may be expressed as "first side," and "back side" may be expressed as "second side," and vice versa.

The term "near" may be intended to mean that one among two or more components is located within relatively close proximity of a certain other component. For example, it should be understood that when a first end is near a first side, the first end may be closer to the first side than a second end, or the first end may be closer to the first side than to a second side.

Figure 2:
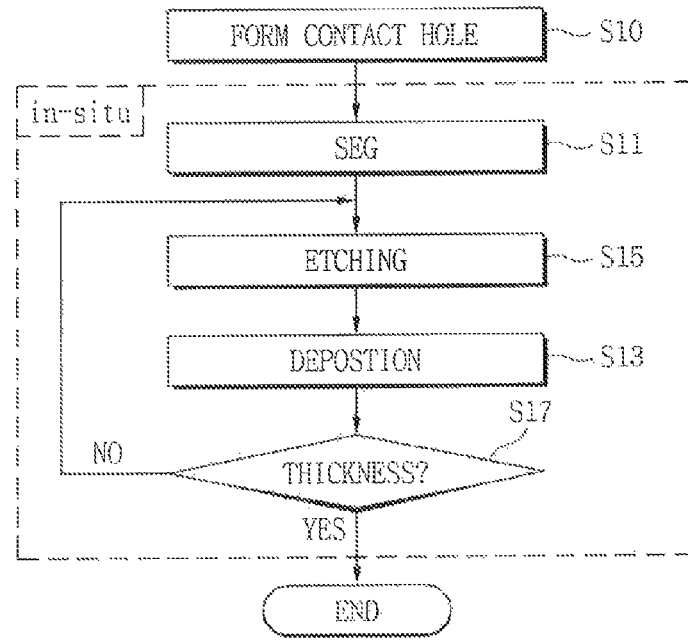

FIGS. 1 and 2 are flowcharts illustrating methods of forming a semiconductor device in accordance with exemplary embodiments of the present inventive concept.

Referring to FIG. 1, a method of forming a semiconductor device in accordance with exemplary embodiments of the present inventive concept may include forming a contact hole (S10), performing a selective epitaxial growth (SEG) process (S11), performing a deposition process (S13), performing an etching process (S15), and checking the thickness (S17). The deposition process (S13) and the etching process (S15) may be alternately and repeatedly performed. The SEG process (S11), the deposition process (S13), and the etching process (S15) may be performed in the same chamber using an in-situ process.

Referring to FIG. 2, a method of forming a semiconductor device in accordance with exemplary embodiments of the present inventive concept may include forming a contact hole (S10), performing an SEG process (S11), performing an etching process (S15), performing a deposition process (S13), and checking the thickness (S17). The etching process (S15) and the deposition process (S13) may be alternately and repeatedly performed. The SEG process (S11), the etching process (S15), and the deposition process (S13) may be performed in the same chamber using an in-situ process.

Figure 3:
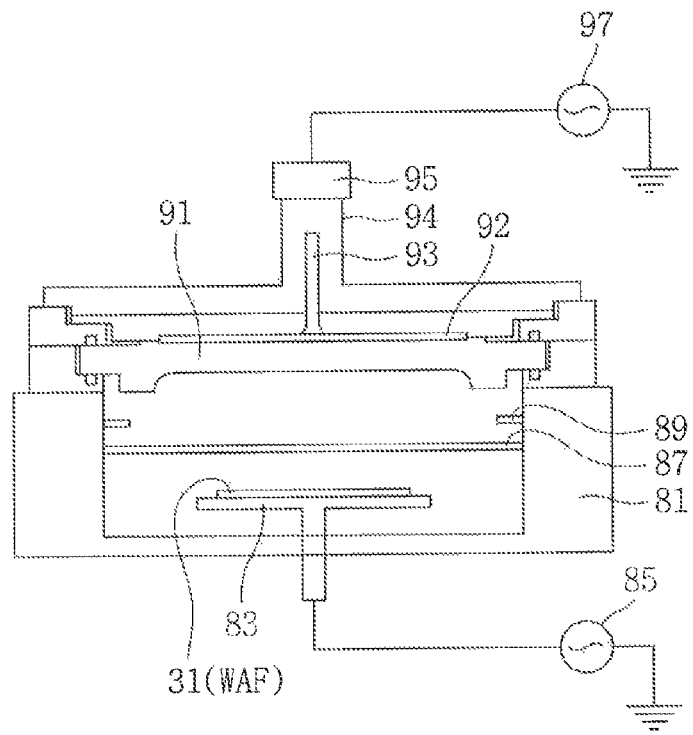
FIG. 3 is a schematic diagram showing a semiconductor manufacturing apparatus available for the formation of a semiconductor device in accordance with exemplary embodiments of the present inventive concept.

FIG. 3 is a schematic diagram showing a semiconductor manufacturing apparatus available for the formation of a semiconductor device in accordance with exemplary embodiments of the present inventive concept.

Referring to FIG. 3, the semiconductor manufacturing apparatus may include a chamber 81, a susceptor 83, an RF supply 85, a shower head 87, a gas nozzle 89, an insulating cover 91, an antenna 92, an antenna connector 93, a waveguide 94, a load matching device 95, and a microwave supply 97. A substrate 31 may be loaded onto the susceptor 83. The substrate 31 may be a semiconductor substrate, such as a single crystalline silicon wafer or a silicon on insulator (SOI) wafer, for example.

The chamber 81 may be a low-pressure chamber having a gas pressure ranging from about 5 mTorr to about 200 mTorr. For example, the chamber 81 may be a low-pressure chamber having a gas pressure of about 30 mTorr. The susceptor 83 may be disposed in the chamber 81. The susceptor 83 may be heated to from about 200° C. to about 600° C. For example, the susceptor 83 may be heated to about 450° C. The susceptor 83 may heat the substrate 31. The RF supply 85 may be connected to the susceptor 83. The RF supply 85 may supply an RF bias ranging from about 100 W to about 300 W at a frequency of from about 5 MHz to about 500 MHz to the susceptor 83.

The shower head 87 may be disposed above the susceptor 83 in the chamber 81. The gas nozzle 89 may be disposed above the shower head 87. More than one gas nozzle 89 may be disposed. The insulating cover 91 may cover a ceiling of the chamber 81. The antenna 92 may be disposed on the insulating cover 91. The antenna connector 93 and the waveguide 94 may be disposed on the antenna 92. The load matching device 95 may be disposed on the waveguide 94. The microwave supply 97 may be connected to the load matching device 95. The microwave supply 97 may supply microwaves ranging from about 1500 W to about 4000 W at a frequency of from about 1 GHz to about 10 GHz. For example, the microwave supply 97 may supply microwaves of 2500 W at 2.45 GHz.

Figure 4:
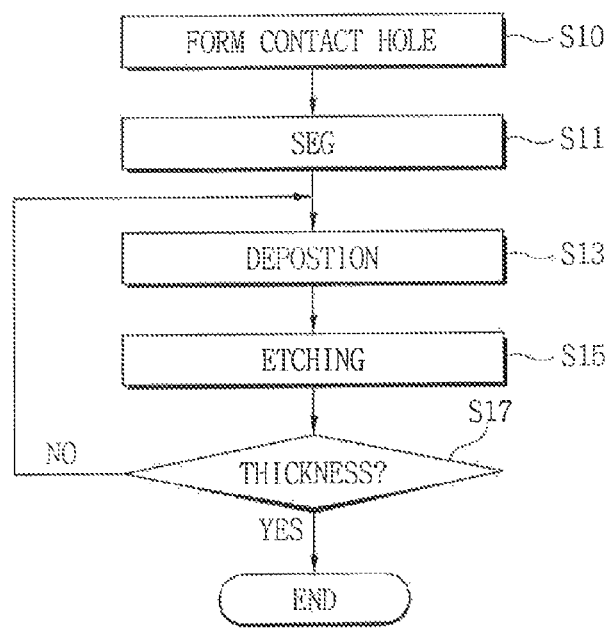
FIGS. 4 and 5 are flowcharts describing methods of forming a semiconductor device in accordance with exemplary embodiments of the present inventive concept.
Figure 5:
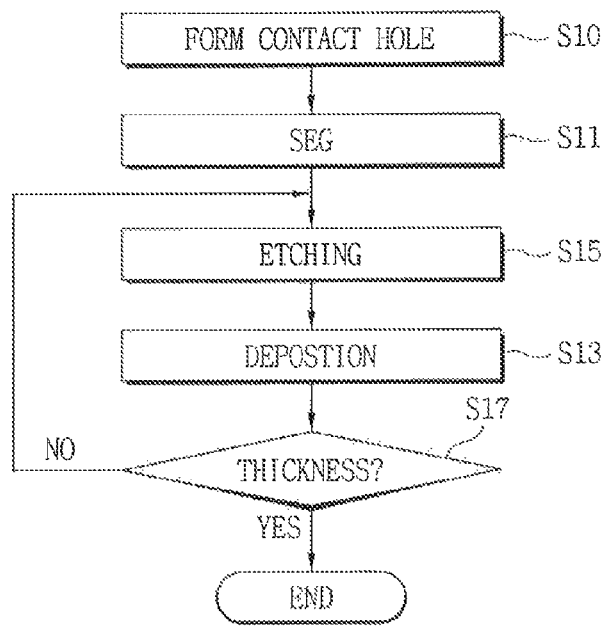

FIGS. 4 and 5 are flowcharts illustrating methods of forming a semiconductor device in accordance with exemplary embodiments of the present inventive concept.

Referring to FIG. 4, a method of forming a semiconductor device in accordance with exemplary embodiments of the present inventive concept may include forming a contact hole (S10), performing an SEG process (S11), performing a deposition process (S13), performing an etching process (S15), and checking the thickness (S17). The deposition process (S13) and the etching process (S15) may be alternately and repeatedly performed.

Referring to FIG. 5, a method of forming a semiconductor device in accordance with exemplary embodiments of the present inventive concept may include forming a contact hole (S10), performing an SEG process (S11), performing an etching process (S15), performing a deposition process (S13), and checking the thickness (S17). The etching process (S15) and the deposition process (S13) may be alternately and repeatedly performed.

Figure 6:
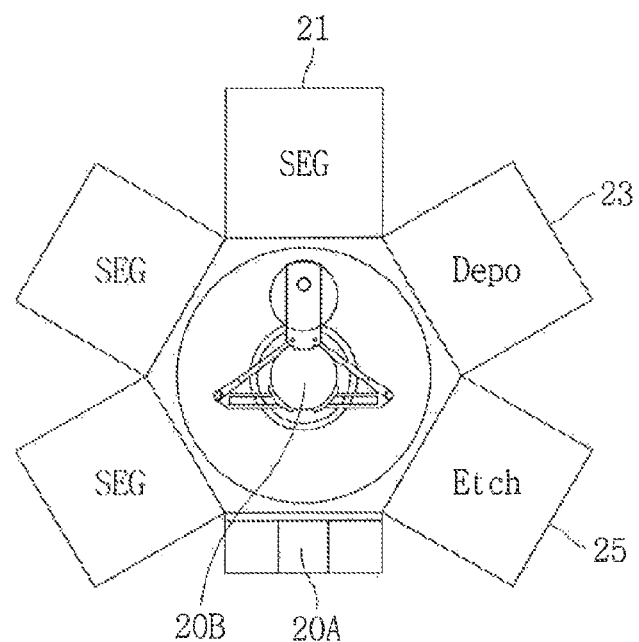
FIG. 6 is a schematic diagram showing a semiconductor manufacturing apparatus available for the formation of a semiconductor device in accordance with exemplary embodiments of the present inventive concept.

FIG. 6 is a schematic diagram showing a semiconductor manufacturing apparatus available for the formation of a semiconductor device in accordance with exemplary embodiments of the present inventive concept.

Referring to FIG. 6, the semiconductor manufacturing apparatus may include an input/output device 20A, a transporting device 20B, an SEG chamber 21, a deposition chamber 23, and an etching chamber 25.

The SEG chamber 21 may have a configuration similar to the semiconductor manufacturing apparatus described with reference to FIG. 3. The SEG chamber 21 may include the chamber (reference numeral 81 in FIG. 3) and related devices. The deposition chamber 23 may be disposed adjacent to the SEG chamber 21. The deposition chamber 23 may be configured to maintain a low pressure ranging from about 2 mTorr to about 10 mTorr, and at a temperature from about 500° to about 600° C.. A source gas, a reactive gas, and/or a dopant gas may be supplied in the deposition chamber 23. The deposition chamber 23 may have a configuration in which an RF supply and a microwave supply are omitted. The etching chamber 25 may be disposed adjacent to the deposition chamber 23. The etching chamber 25 may have a configuration similar to the semiconductor manufacturing apparatus described with reference to FIG. 3. The etching chamber 25 may include the chamber (reference numeral 81 in FIG. 3) and related devices.

FIGS. 7 to 13 are cross-sectional views illustrating a method of forming a semiconductor device in accordance with exemplary embodiments of the present inventive concept.

Figure 7:
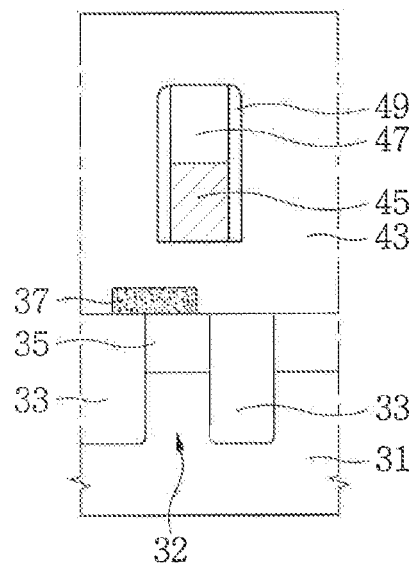
FIGS. 7 to 13 are cross-sectional views illustrating a method of forming a semiconductor device in accordance with exemplary embodiments of the present inventive concept.

Referring to FIGS. 1, 3, and 7, a device isolation layer 33 defining an active region 32 may be formed on a substrate 31. A drain area 35 may be formed in the active region 32. A sacrificial pattern 37 may be formed on the drain area 35 and the device isolation layer 33. An interlayer insulating layer 43 covering the drain area 35, device isolation layer 33, and sacrificial pattern 37 may be formed. A bitline 45, a capping pattern 47, and a bitline spacer 49 may be formed in the interlayer insulating layer 43. The drain area 35 may be a semiconductor pattern or a conductive pattern.

The substrate 31 may be a semiconductor substrate, such as a single crystalline silicon wafer or an SOI wafer. The substrate 31 may include p-type impurities or n-type impurities. The device isolation layer 33 may be formed by a shallow trench isolation (STI) process, for example. The device isolation layer 33 may include an insulating layer, such as silicon oxide, silicon nitride, silicon oxynitride, or a combination thereof. The drain area 35 may be formed by injecting p-type impurities or n-type impurities in a part of the active region 32. For example, the drain area 35 may include n-type impurities, and the active region 32 may include p-type impurities. The active region 32 may be disposed under the drain area 35. A plurality of active/passive devices, such as a transistor, a diode, or a wordline, may be formed in and/or on the active region 32.

The sacrificial pattern 37 may include a material having an etch selectivity with respect to the device isolation layer 33, the drain area 35, and the interlayer insulating layer 43. The sacrificial pattern 37 may include a different material from the device isolation layer 33, the drain area 35, and the interlayer insulating layer 43. For example, the sacrificial pattern 37 may include silicon nitride. The sacrificial pattern 37 may be in contact with the drain area 35. The sacrificial pattern 37 may have a horizontal width greater than a vertical height thereof. The sacrificial pattern 37 may partially cover the drain area 35, and may extend onto the device isolation layer 33. The center of the sacrificial pattern 37 may be offset from the center of the drain area 35. The sacrificial pattern 37 may be eccentric or offset from the drain area. 35.

The interlayer insulating layer 43 may include an insulating layer, such as silicon oxide, silicon nitride, silicon oxynitride, or a combination thereof. The interlayer insulating layer 43 may include a single layer or multiple layers. The bitline 45 may partially overlap the drain area 35. The bitline 45 may partially overlap the sacrificial pattern 37. The bitline 45 may include a conductive material such as a metal layer. The capping pattern 47 may include an insulating layer, such as silicon oxide, silicon nitride, silicon oxynitride, or a combination thereof. The bitline 45 may be vertically aligned with the capping pattern 47. The bitline spacer 49 may cover side surfaces of the bitline 45 and the capping pattern 47. The bitline spacer 49 may include an insulating layer, such as silicon oxide, silicon nitride, silicon oxynitride, or a combination thereof.

Figure 8:
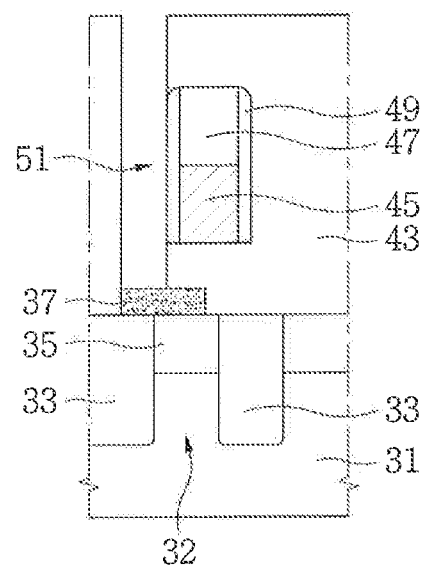

Referring to FIGS. 1, 3, and 8, an upper contact hole 51 may be formed by patterning the interlayer insulating layer 43, for example. The upper contact hole 51 may pass through the interlayer insulating layer 43. The sacrificial pattern 37 may be exposed on a bottom of the upper contact hole 51. The upper contact hole 51 may have a vertical height greater than a horizontal width thereof. For example, the upper contact hole 51 may have a high aspect ratio greater than or equal to 20 to 1. The upper contact hole 51 may bypass the bitline 45.

In exemplary embodiments of the present inventive concept, the upper contact hole 51 may include a trench.

Figure 9:
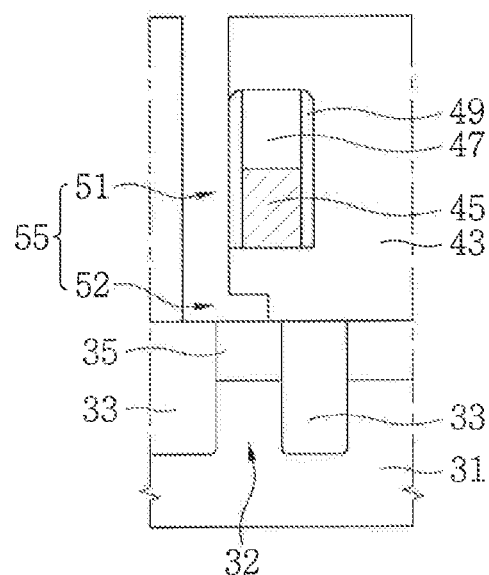

Referring to FIGS. 1, 3, and 9, a lower contact hole 52 may be formed by removing the sacrificial pattern 37. A contact hole 55 may include the upper contact hole 51 and the lower contact hole 52. The contact hole 55 may be formed on the substrate 31 (S10).

The drain area 35 and the device isolation layer 33 may be exposed on a bottom surface of the lower contact hole 52. A horizontal width of the lower contact hole 52 may be greater than that of the upper contact hole 51. The lower contact hole 52 may have a horizontal width greater than a vertical height. The center of the lower contact hole 52 may be offset from the center of the drain area 35. The lower contact hole 52 may be interpreted as being eccentric or offset from the drain area 35. The lower contact hole 52 may be connected to a lower part of the upper contact hole 51. The contact hole 55 may have an "L" shape.

Figure 10:
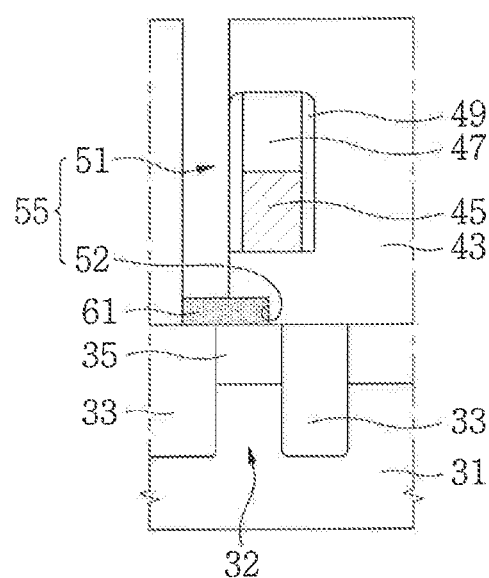

Referring to FIGS. 1, 3, and 10, a lower plug 61 may be formed in the lower contact hole 52. The lower plug 61 may be formed using an SEG process (S11).

For example, the substrate 31 having the contact hole 55 may be loaded onto the susceptor 83. The inside of chamber 81 may be maintained at a relatively low pressure ranging from about 5 mTorr to about 200 mTorr. For example, the inside of chamber 81 may be maintained at a relatively low pressure of 30 mTorr. The susceptor 83 may be heated to a temperature from about 200° C. to about 600° C. For example, the susceptor 83 may be heated to 450° C. The RF supply 85 may be maintained in an off-state. The microwave supply 97 may supply microwaves of from about 1500 W to about 4000 W at from about 1 GHz to about 10 GHz. For example, microwaves of 2500 W at 2.450 GHz may be supplied through the microwave supply 97. The source gas, the reactive gas and/or the dopant gas may be supplied via the gas nozzle 89 and the shower head 87. The source gas may include SiH4, SiH2Cl2, or a combination thereof. The reactive gas may include H2, Ar, Cl2. or a combination thereof. The dopant gas may include PH3 or B2H6.

The SEG process (S11) may be an SEG process using plasma. The SEG process (S11) may be performed at a relatively low temperature, and the doping concentration may be controlled. While performing the SEG process (S11), the lower plug 61 may be sequentially formed on a surface of the drain area 35 exposed in the lower contact hole 52. The lower plug 61 may be an SEG pattern or an SEG plug. The lower plug 61 may include a single crystalline semiconductor. For example, the lower plug 61 may include single crystalline silicon. The lower plug 61 might not have a defect, such as a void or a seam, and the lower plug 61 may tightly fill the inside of the lower contact hole 52.

The lower plug 61 may be in direct contact with the drain area 35. The lower plug 61 may have a horizontal width greater than a vertical height thereof. The center of the lower plug 61 may be offset from the center of the drain area 35. The lower plug 61 may be eccentric or offset from the drain area 35. The lower plug 61 may be partially overlapped by the bitline 45. The lower plug 61 may be spaced apart from the bitline 45. The interlayer insulating layer 43 may be interposed between the lower plug 61 and the bitline 45.

Figure 11:
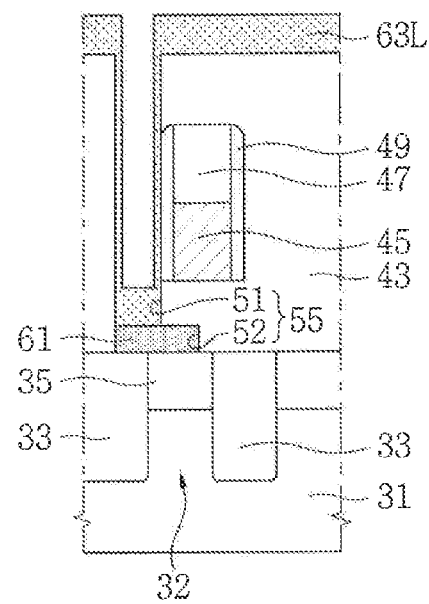

Referring to FIGS. 1, 3, and 11, an upper plug layer 63L may be formed on the lower plug 61. The upper plug layer 63L may be formed by a deposition process (S13). The upper plug layer 63L may cover a surface of the lower plug 61. The upper plug layer 63L may cover a sidewall of the upper contact hole 51 and a surface of the interlayer insulating layer 43. The upper plug layer 63L may be in direct contact with the surface of the lower plug 61.

For example, the substrate 31 having the lower plug 61 may be loaded onto the susceptor 83. The inside of the chamber 81 may be maintained at a relatively low pressure ranging from about 5 mTorr to 200 mTorr. For example, the inside of the chamber 81 may be maintained at a relatively low pressure of 30 mTorr. The susceptor 83 may be heated to from about 200° C. to about 600° C. For example, the susceptor 83 may be heated to 300° C. The RF supply 85 may supply are RF bias ranging from about 100 W to about 300 W at about 5 MHz to about 500 MHz to the susceptor 83. For example, the RF supply 85 may supply a bias power of 250 W. The microwave supply 97 may supply microwaves ranging from about 1500 W to about 4000 W at about 1 GHz to about 10 GHz. For example, microwaves of 2500 W at 2.45 GHz may be supplied through the microwave supply 97. A source gas, a reactive gas, and a dopant gas may be supplied via the gas nozzle 89 and the shower head 87. The source gas may include $SiH_4$, $SiH_2Cl_2$, or a combination thereof. The reactive gas may include $H_2$, Ar, $Cl_2$, or a combination thereof. The dopant gas may include $PH_3$ or $B_2H_6$.

The deposition process (S13) may include an anisotropic deposition process using plasma. The upper plug layer 63L may include polysilicon.

In exemplary embodiments of the present inventive concept, the upper plug layer 63L may include a metal.

Figure 12:
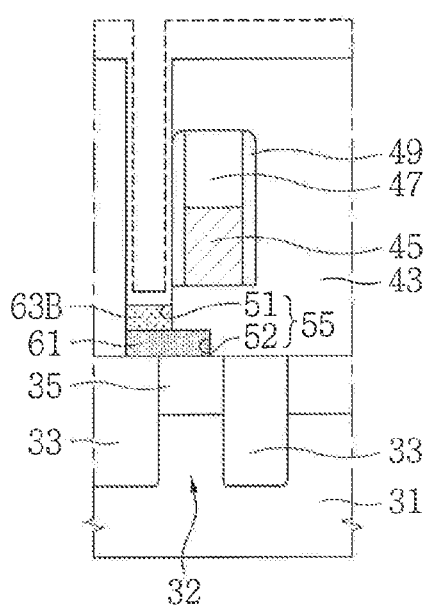

Referring to FIGS. 1, 3, and 12, an upper plug pattern 63B may be formed on the lower plug 61 by partially removing the upper plug layer 63L. The upper plug pattern 63B may be formed by an etching process (S15). The upper plug pattern 63B may be in direct contact with the lower plug 61.

For example, the substrate 31 having the upper plug layer 63L may be loaded onto the susceptor 83. The inside of the chamber 81 may be maintained at a relatively low pressure ranging from about 5 mTorr to about 200 mTorr. For example, the inside of the chamber 81 may be maintained at a relatively low pressure of 30 mTorr. The susceptor 83 may be heated to from about 200° C. to about 600° C. The RF supply 85 may be maintained in an off-state. In an exemplary embodiment of the present inventive concept, the RF supply 85 may supply a lower bias power than in the deposition process (S13). The microwave supply 97 may supply microwaves ranging from about 1500 W to about 4000 W at from about 1 GHz to about 10 GHz. For example, microwaves of 2500 W at 2.45 GHz may be supplied through the microwave supply 97. An etching gas may be supplied via the gas nozzle 89 and the shower head 87. The etching gas may include $NF_3$, $Cl_2$, HCl, Ar, or a combination thereof.

The etching process (S15) may include an isotropic etching process or a low bias etching process. While performing the etching process (S15), the upper plug layer 63L may be etched to form the upper plug pattern 63B. The upper plug pattern 63B may be formed in the upper contact hole 51. The upper plug pattern 63B may be retained at a lower part of the upper contact hole 51.

Figure 13:
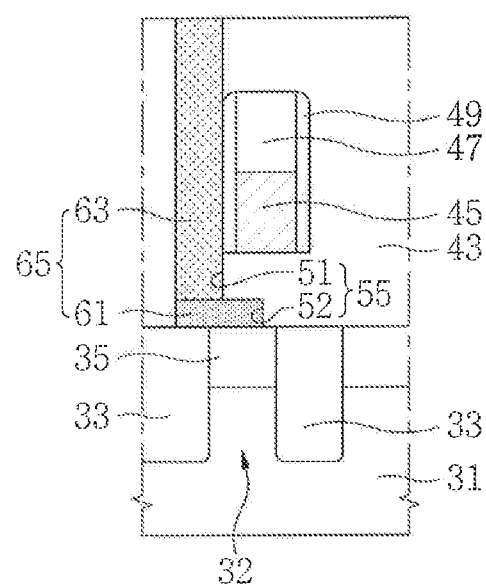

Referring to FIGS. 1, 3, and 13, an upper plug 63 may be formed. The upper filling plug may fill the upper contact hole 51. The upper plug 63 may be formed by performing the deposition process (S13) and the etching process (S15) alternately and repeatedly. The upper plug 63 may include polysilicon. The upper plug 63 may be a polysilicon plug.

The upper plug 63 may be in direct contact with the lower plug 61. The upper plug 63 may have a vertical height greater than a horizontal width. The upper plug 63 may have a high aspect ratio greater than or equal to 20 to 1. The upper plug 63 may fully fill the upper contact hole 51. The upper plug 63 might not include a defect, such as a void or a seam, and the upper plug 63 may tightly fill the upper contact hole 51. The upper plug 63 may bypass the bitline 45. The upper plug 63 may be spaced apart from the bitline 45. The upper plug 63 may be isolated from the bitline 45.

In exemplary embodiments of the present inventive concept, the upper plug 63 may include a metal.

The SEG process (S11), the etching process (S15), and the deposition process (S13) may be performed in the chamber 81 using an in-situ process. A contact plug 65 may include the upper plug 63 and the lower plug 61. The contact plug 65 may have an "L" shape. The contact plug 65 may bypass the bitline 45 and may be connected to the drain area 35.

FIGS. 14 to 26 are cross-sectional views illustrating a method of forming a semiconductor device in accordance with exemplary embodiments of the present inventive concept.

Figure 14:
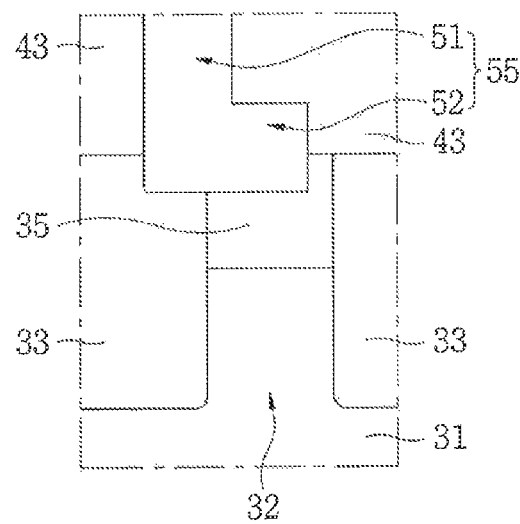
FIGS. 14 to 26 are cross-sectional views illustrating a method of forming a semiconductor device in accordance with exemplary embodiments of the present inventive concept.

Referring to FIG. 14, a lower contact hole 52 may expand to a lower level than an upper end of a drain area 35. The lower contact hole 52 may expand to a lower level than an upper end of a device isolation layer 33. The drain area 35 may have a step exposed in the lower contact hole 52. A surface of the drain area 35 may be exposed on side and bottom surfaces of the lower contact hole 52. The device isolation layer 33 may have a step exposed in the lower contact hole 52.

Figure 15:
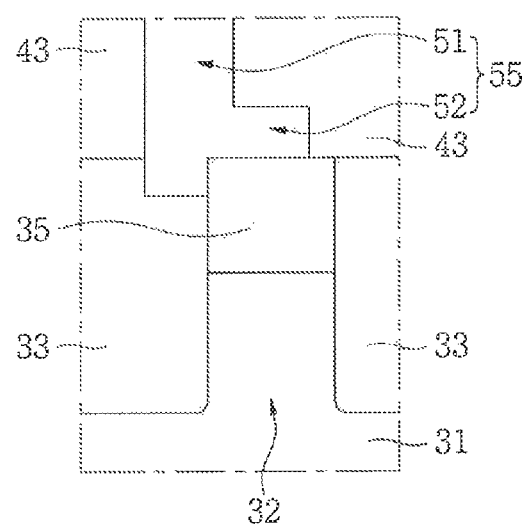

Referring to FIG. 15, a lower contact hole 52 may expand to a lower level than an upper end of a drain area 35. The lower contact hole 52 may expand to a lower level than an upper end of a device isolation layer 33. The device isolation layer 33 may have a step exposed in the lower contact hole 52. The lower contact hole 52 may expose upper and side surfaces of the drain area 35.

Figure 16:
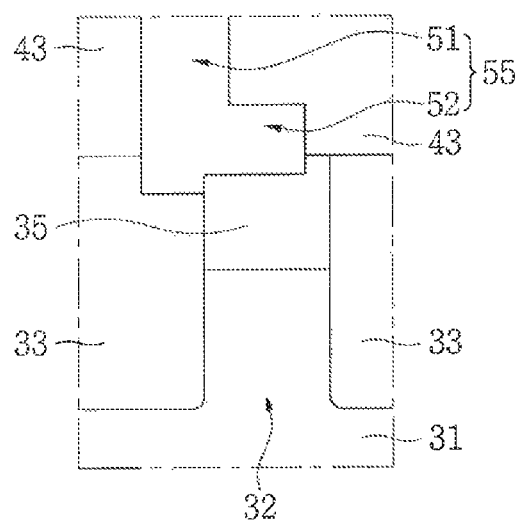

Referring to FIG. 16, a lower contact hole 52 may expand to a lower level than an upper end of a drain area 35. The lower contact hole 52 may expand at a lower level than an upper end of a device isolation layer 33. The drain area 35 may have a step exposed in the lower contact hole 52. A surface of the drain area 35 may be exposed on side and bottom surfaces of the lower contact hole 52. The device isolation layer 33 may have a step exposed in the lower contact hole 52. The lower contact hole 52 may expose upper and side surfaces of the drain area 35.

Figure 17:
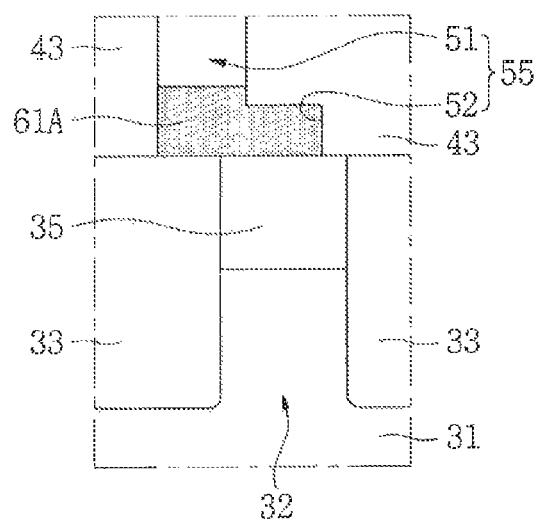

Referring to FIG. 17, a lower plug 61A may fill a lower contact hole 52 and extend into an upper contact hole 51. The lower plug 61A may protrude to a higher level than the lower contact hole 52.

Figure 18:
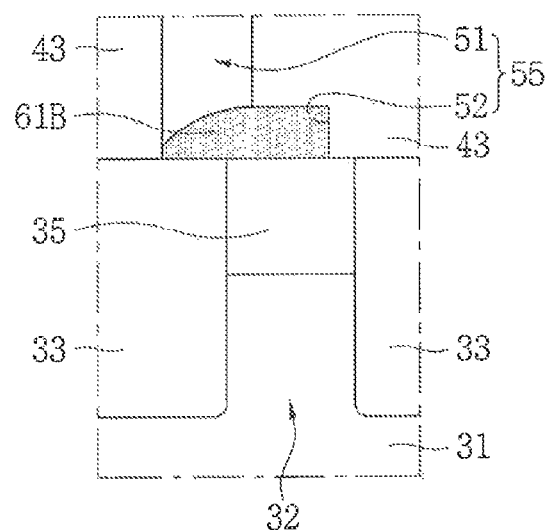

Referring to FIG. 18, a lower plug 61B may include an inclined upper surface.

Figure 19:
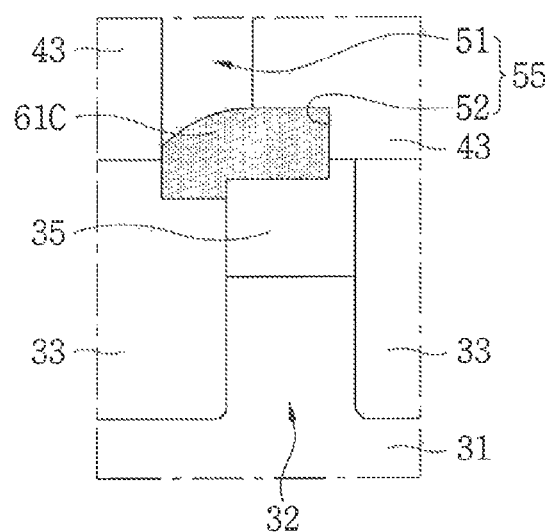
Figure 20:
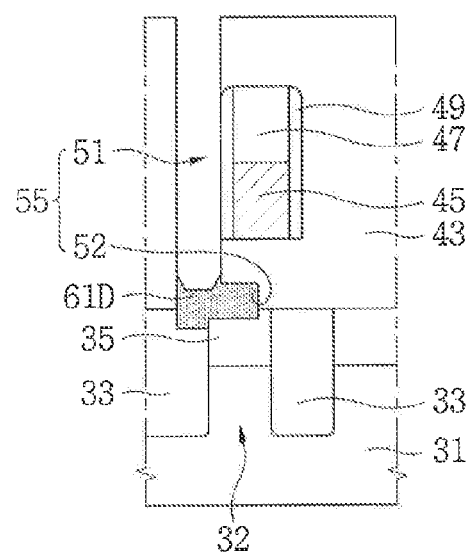

Referring to FIG. 19, a lower plug 61C may include an inclined upper surface. An upper surface of a drain area 35 may have a step. An upper surface of a device isolation layer 33 may have a step. The lower plug 61C may be in direct contact with upper and side surfaces of the drain area 35.

Referring to FIGS. 2, 3, 7 to 10, and 20, an active region 32, a device isolation layer 33, a drain area 35, an interlayer insulating layer 43, a bitline 45, a capping pattern 47, a bitline spacer 49, an upper contact hole 51, and a lower contact hole 52 may be formed on a substrate 31. A contact hole 55 may be formed (S10) and may include the upper contact hole 51 and the lower contact hole 52.

A lower plug 61D may be formed in the lower contact hole 52. The lower plug 61D may be formed by an SEG process (S11).

For example, the substrate 31 having the contact hole 55 may be loaded onto the susceptor 83. The inside of the chamber 81 may be maintained at a relatively low pressure ranging from about 5 mTorr to about 200 mTorr. For example, the inside of the chamber 81 may be maintained at a relatively low pressure of 30 mTorr. The susceptor 83 may be heated to from about 200° to about 600° C. For example, the susceptor 83 may be heated to 450° C. The RF supply 85 may be maintained in an off-state. The microwave supply 97 may supply microwaves ranging from about 1500 W to about 4000 W at a frequency of from about 1 GHz to about 10 GHz. For example, microwaves of 2500 W at 2.45 GHz may be supplied through the microwave supply 97. A source gas, a reactive gas, and a dopant gas may be supplied via the gas nozzle 89 and the shower head 87. The source gas may include $SiH_4$, $SiH_2Cl_2$, or a combination thereof. The reactive gas may include $H_2$, Ar, $Cl_2$, or a combination thereof. The dopant gas may include $PH_3$ or $B_2H_6$.

The SEG process (S11) may include an SEG process using plasma. The lower plug 61D may be an SEG pattern.

An upper surface of the lower plug 61D may be etched by an etching process (S15).

For example, the substrate 31 having the lower plug 61D may be loaded onto the susceptor 83. The inside of the chamber 81 may be maintained at a relatively low pressure ranging from about 5 mTorr to about 200 mTorr. For example, the inside of the chamber 81 may be maintained at a low pressure of 30 mTorr. The susceptor 83 may be heated to from about 200° C. to about 600° C. The RF supply 85 may be maintained in an off-state. In an exemplary embodiment of the present inventive concept, the RF supply 85 may supply a lower bias power than in the deposition process (e.g., S13 in FIG. 1). The microwave supply 97 may supply microwaves ranging from about 1500 W to about 4000 W at a frequency of from about 1 GHz to about 10 GHz. For example, microwaves of 2500 W at a frequency of 2.45 GHz may be supplied through the microwave supply 97. An etching gas may be supplied via the gas nozzle 89 and the shower head 87. The etching gas may include NF3, Cl2, HCl, Ar, or a combination thereof.

The etching process (S15) may include an isotropic etching process or a low bias etching process. While performing the etching process (S15), an upper surface of the lower plug 61D may be etched. An upper end of the lower plug 61D may protrude along a sidewall of the contact hole 55. The closer to the sidewall of the upper contact hole 51, the higher the upper end of the lower plug 61D may protrude. A recessed area aligned with the center of the upper contact hole 51 may be formed on the upper surface of the lower plug 61D.

Figure 21:
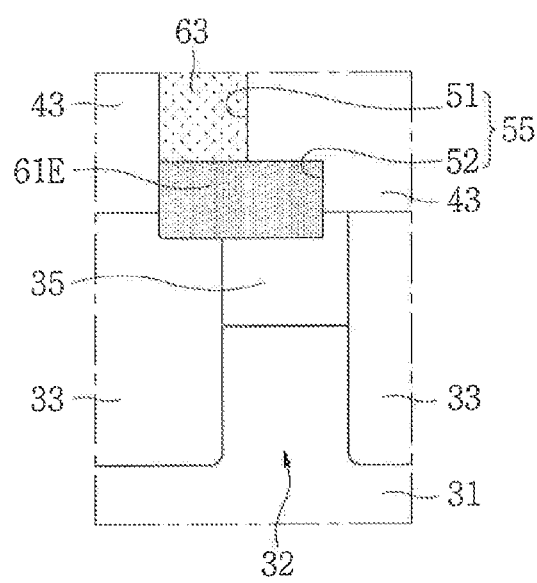

Referring to FIG. 21, a lower end of a lower plug 61E may be formed at a lower level than upper ends of the drain area 35 and the device isolation layer 33. The drain area 35 may protrude to a higher level than the lower end of the lower plug 61E. The drain area 35 may be in direct contact with a bottom and side surfaces of the lower plug 61E.

Figure 22:
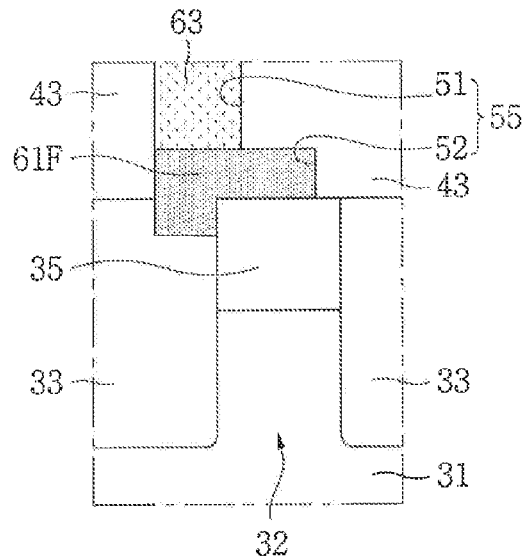

Referring to FIG. 22, a lower end of a lower plug 61F may be formed at a lower level than upper ends of the drain area 35 and the device isolation layer 33. The lower plug 61F may be in direct contact with top and side surfaces of the drain area 35.

Figure 23:
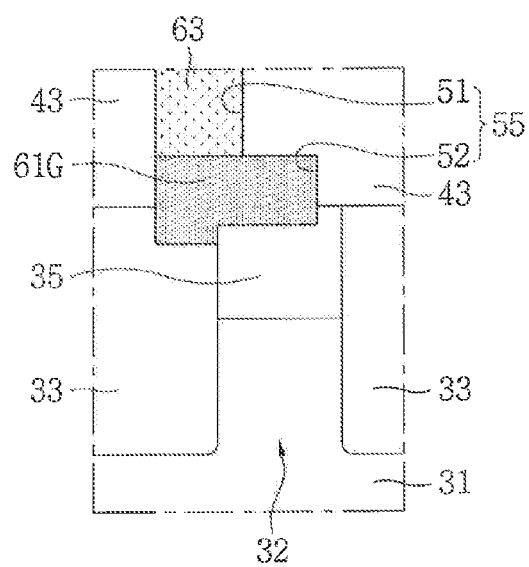

Referring to FIG. 23, a lower end of a lower plug 61G may be formed at a lower level than upper ends of the drain area 35 and the device isolation layer 33. The drain area 35 may protrude to a higher level than the lower end of the lower plug 61G. The drain area 35 may be in direct contact with bottom and side surfaces of the lower plug 61G. The lower plug 61G may be in direct contact with side and top surfaces of the drain area 35.

Figure 24:
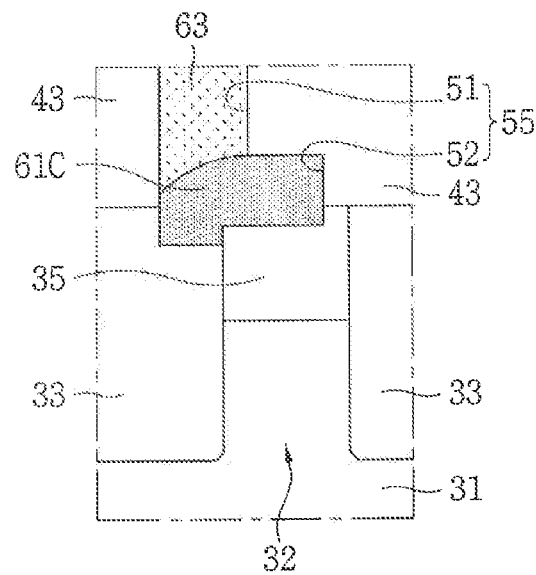
Figure 25:
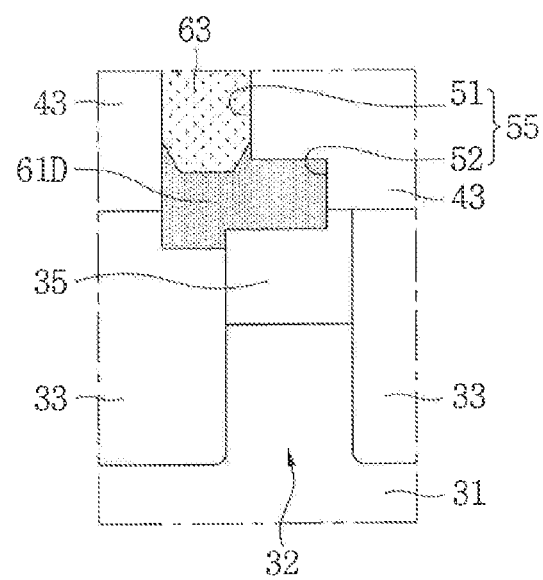

Referring to FIG. 24, a lower plug 61C may include an inclined upper surface. An upper surface of a drain area 35 may have a step. An upper surface of a device isolation layer 33 may have a step. The lower plug 61C may be in direct contact with top and side surfaces of the drain area 35. An upper plug 63 may be formed on the lower plug 61C. The upper plug 63 may be in direct contact with the lower plug 61C.

Referring to FIGS. 2, 3, 7 to 13, 20, and 25, the upper plug 63 may be formed on the lower plug 61D. The upper plug 63 may be formed by the deposition process (S13) and the etching process (S15). The SEG process (S11), the etching process (S15), and the deposition process (S13) may be performed in the chamber 81 using an in-situ process. A lower end of the upper plug 63 may be formed at a lower level than an upper end of the lower plug 61D. The upper end of the lower plug 61D may protrude up along an edge of the upper plug 63.

The deposition process (S13) may include loading the substrate 31 having the lower plug 61D on the susceptor 83. The inside of the chamber 81 may be maintained at a relatively low pressure ranging from about 5 mTorr to about 200 mTorr. For example, the inside of the chamber 81 may be maintained at a relatively low pressure of 30 mTorr. The susceptor 83 may be heated to from about 200° C. to about 600° C. For example, the susceptor 83 may be heated to 300° C. RF supply 85 may supply an RF bias ranging from about 100 W to about 300 W at a frequency of from about 5 MHz to about 500 MHz to the susceptor 83. For example, the RF supply 85 may supply bias power of 250 W. The microwave supply 97 may supply microwaves ranging from about 1500 W to about 4000 W at a frequency of from about 1 GHz to about 10 GHz. For example, microwaves of 2500 W at a frequency of 2.45 GHz may be supplied through the microwave supply 97. A source gas, a reactive gas, and a dopant gas may be supplied via the gas nozzle 89 and the shower head 87. The source gas may include $SiH_4$, $SiH_2Cl_2$, or a combination thereof. The reactive gas may include $H_2$, Ar, $Cl_2$, or a combination thereof. The dopant gas may include $PH_3$ or $B_2H_6$.

Figure 26:
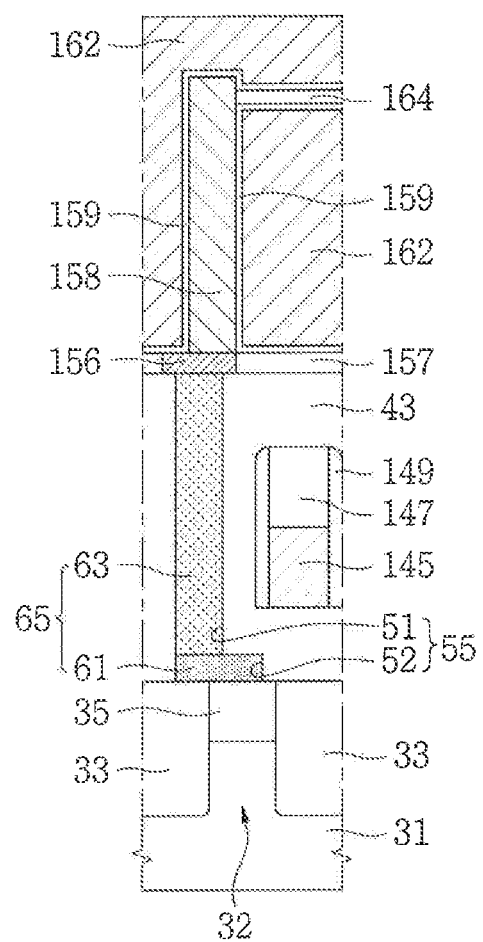

Referring to FIG. 26, an active region 32, a device isolation layer 33, a drain area 35, an interlayer insulating layer 43, a bitline 45, a capping pattern 47, a bitline spacer 49, a contact hole 55, and a contact plug 65 may be formed on a substrate 31. An etch stopping layer 157 may be formed on the interlayer insulating layer 43. A landing pad 156 passing through the etch stopping layer 157 and connected to the contact plug 65 may be formed. A lower electrode 158 may be formed on the landing pad 156. A supporter 164 disposed close to an upper end of the lower electrode 158 may be formed. A capacitor dielectric layer 159 covering surfaces of the lower electrode 158 and the supporter 164 may be formed. An upper electrode 162 may be formed on the capacitor dielectric layer 159.

The contact plug 65 may be a buried contact plug. The etch stopping layer 157 may include a different material from that of the interlayer insulating layer 43. For example, the etch stopping layer 157 may include silicon nitride. The landing pad 156 may include a conductive material, such as a metal, polysilicon, conductive carbon, or a combination thereof. The lower electrode 158 may have a vertical height greater than a horizontal width. The lower electrode 158 may have various shapes, such as a pillar shape, a cylindrical shape, a crown shape, a cup shape, or a combination thereof. The lower electrode 158 may include a conductive material, such as a metal, polysilicon, conductive carbon, or a combination thereof.

The supporter 164 may be in contact with the lower electrode 158. The supporter 164 may prevent collapsing of the lower electrode 158. The supporter 164 may include an adhesive material and the supporter 164 may be adhered to the lower electrode 158. The supporter 164 may include silicon nitride, a metal oxide, or a combination thereof. The capacitor dielectric layer 159 may be formed between the lower electrode 158 and the upper electrode 162. The capacitor dielectric layer 159 may include silicon oxide, silicon nitride, silicon oxynitride, high-K dielectrics, or a combination thereof. The upper electrode 162 may include a conductive material, such as a metal, polysilicon, conductive carbon, or a combination thereof.

Referring to FIGS. 4, 6, and 7 to 26, the active region 32, the device isolation layer 33, the drain area 35, the interlayer insulating layer 43, the bitline 45, the capping pattern 47, the bitline spacer 49, the upper contact hole 51, and the lower contact hole 52 may be formed on the substrate 31. The upper contact hole 51 and the lower contact hole 52 may configure a contact hole 55 (S10).

The lower plug 61 may be formed in the contact hole 55. The lower plug 61 may be formed using an SEG process (S11). For example, the substrate 31 having the contact hole 55 may be loaded into the SEG chamber 21. The SEG chamber 21 may have a similar configuration to the semiconductor manufacturing apparatus described with reference to FIG. 3. The SEC chamber 21 may include the chamber (e.g., reference numeral 81 in FIG. 30) and related devices. The SEG process (S11) may be an SEG process using plasma.

An upper plug layer 63L may be formed on the lower plug 61. The upper plug layer 63L may be formed by a deposition process (S13). The deposition process (S13) may be performed in the deposition chamber 23. For example, the substrate 31 having the lower plug 61 may be transported from the SEG chamber 21 to the inside of the deposition chamber 23 by the transporting device 20B. Process conditions for the formation of the upper plug layer 63L in the deposition chamber 23 may include a relatively low pressure ranging from about 2 mTorr to about 10 mTorr, a temperature of from about 500° C. to about 600° C., a source gas, a reactive gas, and a dopant gas. The source gas may include $SiH_4$, $SiH_2Cl_2$, or a combination thereof. The reactive gas may include $H_2$, Ar, $Cl_2$, or a combination thereof. The dopant gas may include $PH_3$ or $B_2H_6$. The deposition chamber 23 may have a configuration in which an RF supply and a microwave supply are omitted. The deposition process (S13) may include a thermal deposition process. The upper plug layer 63L may include polysilicon.

An upper plug pattern 63B may be formed on the lower plug 61 by partially removing the upper plug layer 63L. The upper plug pattern 63B may be formed by an etching process (S15). The etching process (S15) may be performed in the etching chamber 25. For example, the substrate 31 having the upper plug layer 63L may be transported from the deposition chamber 23 to the etching chamber 25 by the transporting device 20B. The etching chamber 25 may have a similar configuration to the semiconductor manufacturing apparatus described with reference to FIG. 3. The etching chamber 25 may include the chamber (e.g., reference numeral 81 in FIG. 3) and related devices. The etching process (S15) may include an isotropic etching process or a low bias etching process. While performing the etching process (S15), the upper plug layer 63L may be etched to form the upper plug pattern 63B.

An upper plug 63 filling the upper contact hole 51 may be formed. The upper plug 63 may be formed by alternately and repeatedly performing the deposition process (S13) and the etching process (S15). The upper plug 63 may include polysilicon.

Referring to FIGS. 5 to 26, the active region 32, the device isolation layer 33, the drain area 35, the interlayer insulating layer 43, the bitline 45, the capping pattern 47, the bitline spacer 49, the upper contact hole 51, and the lower contact hole 52 may be formed on the substrate 31. The contact hole 55 may be formed (S10) and may include the upper contact hole 51 and the lower contact hole 52.

A lower plug 61D may be formed in the contact hole 55. The lower plug 61D may be formed by an SEG process (S11). For example, the substrate 31 having the contact hole 55 may be loaded into the SEG chamber 21. The SEG chamber 21 may have a similar configuration to the semiconductor manufacturing apparatus described with reference to FIG. 3. The SEG chamber 21 may include the chamber (e.g., reference numeral 81 in FIG. 3) and related devices. The SEG process (S11) may include an SEG process using plasma.

An upper surface of the lower plug 61D may be etched by an etching process (S15).

The etching process (S15) may be performed in the etching chamber 25. For example, the substrate 31 having the lower plug 61D may be transported from the deposition chamber 23 to the inside of the etching chamber 25 by the transporting device 20B. The etching chamber 25 may have a similar configuration to the semiconductor manufacturing apparatus described with reference to FIG. 3. The etching chamber 25 may include the chamber (e.g., reference numeral 81 in FIG. 3) and related devices. The etching process (S15) may include an isotropic etching process or a low bias etching process. While performing the etching process (S15), the upper surface of the lower plug 61D may be etched back.

An upper plug 63 may be formed on the lower plug 61D. The upper plug 63 may be formed by the deposition process (S13) and the etching process (S15). The deposition process (S13) may be performed in the deposition chamber 23. For example, the substrate 31 having the lower plug 61D may be transported from the etching chamber 25 to the inside of the deposition chamber 23 by the transporting device 20B. Process conditions for the formation of the upper plug layer 63 in the deposition chamber 23 may include a relatively low pressure ranging from about 2 mTorr to about 10 mTorr, a temperature of from about 500° C. to about 600° C., a source gas, a reactive gas, and a dopant gas. The source gas may include SiH4, SiH2Cl2, or a combination thereof. The reactive gas may include $H_2$, Ar, $Cl_2$, or a combination thereof. The dopant gas may include $PH_3$ or $B_2H_6$. The deposition chamber 23 may have a configuration in which an RF supply and a microwave supply are omitted. The deposition process (S13) may include a thermal deposition process. The upper plug layer 63L may include polysilicon.

Figure 27:
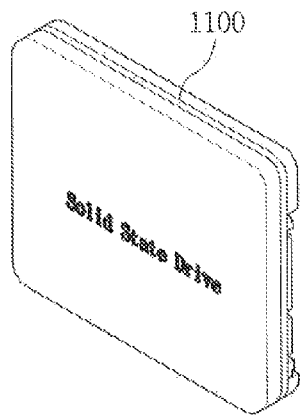
FIGS. 27 to 32 are perspective views and system block diagrams of electronic apparatuses in accordance with exemplary embodiments of the present inventive concept
Figure 28:
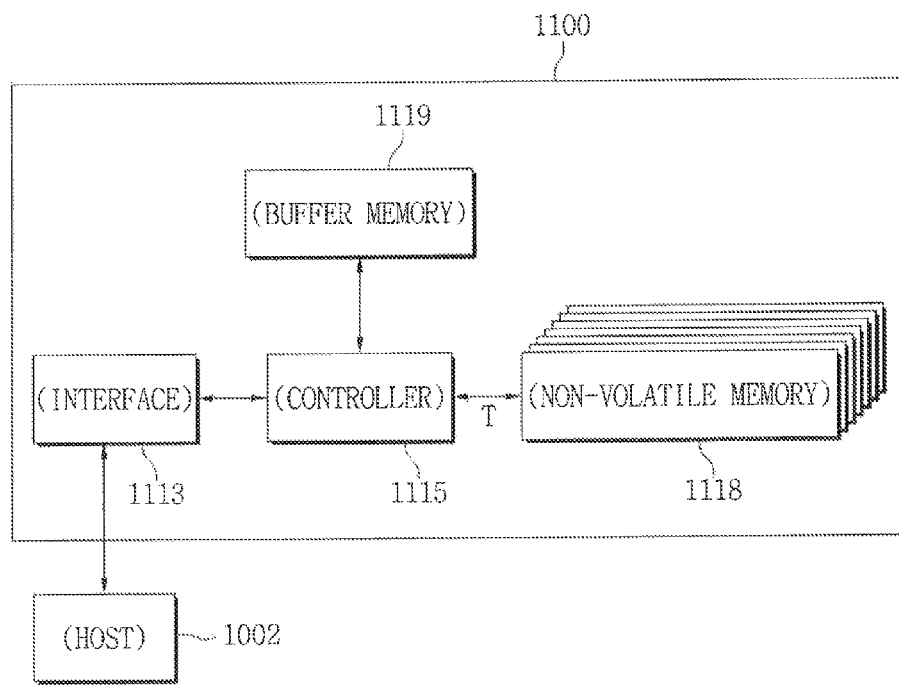

FIG. 27 is a perspective view of an electronic apparatus in accordance with exemplary embodiments of the present inventive concept, and FIG. 28 is a system block diagram of an electronic apparatus in accordance with exemplary embodiments of the present inventive concept. The electronic apparatus may be a data storage apparatus such as a solid state drive (SSD) 1100.

Referring to FIGS. 27 and 28, the SSD 1100 may include an interface 1113, a controller 1115, a non-volatile memory 1118, and a buffer memory 1119. The SSD 1100 may be an apparatus that stores information using a semiconductor device. The SSD 1100 may be faster, may have a lower mechanical delay or failure rate, and may generate less heat and noise than a hard disk drive (HDD). The SSD 1100 may be smaller and lighter than the HDD. The SSD 1100 may be used in a laptop computer, a notebook PC, a desktop PC, an MP3 player, or a portable storage apparatus, for example.

The controller 1115 may be close to the interface 1113 and may be electrically connected thereto. The controller 1115 may include a microprocessor including a memory controller and a buffer controller. The non-volatile memory 1118 may be close to the controller 1115 and may be electrically connected thereto. Data storage capacity of the SSD 1100 may correspond to the capacity of the non-volatile memory 1118. The buffer memory 1119 may be disposed close to the controller 1115 and may be electrically connected thereto.

The interface 1113 may be connected to a host 1002, and may send and receive electrical signals, such as data. For example, the interface 1113 may be a device using a standard such as a Serial Advanced Technology Attachment (SATA), an Integrated Drive Electronics (IDE), a Small Computer System Interface (SCSI), and/or a combination thereof. The non-volatile memory 1118 may be connected to the interface 1113 via the controller 1115. The non-volatile memory 1118 may store data received through the interface 1113. When power supplied to the SSD 1100 is interrupted, the data stored in the non-volatile memory 1118 may be retained.

The buffer memory 1119 may include a volatile memory. The volatile memory may be a dynamic random access memory (DRAM) and/or a static random access memory (SRAM). The buffer memory 1119 may have a relatively faster operating speed than the non-volatile memory 1118.

Data processing speed of the interface 1113 may be relatively faster than the operating speed of the non-volatile memory 1118. The buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Frequently-used items of the data stored in the non-volatile memory 1118 may be pre-read and temporarily stored in the buffer memory 1119. The buffer memory 1119 may function to increase effective operating speed of the SSD 1100, and reduce error rate.

The controller 1115, the non-volatile memory 1118, and the buffer memory 1119 may have a configuration as described with reference to FIGS. 1 to 26. For example, the buffer memory 1119 may include the contact plug (e.g., reference numeral 65 in FIG. 26).

Figure 29:
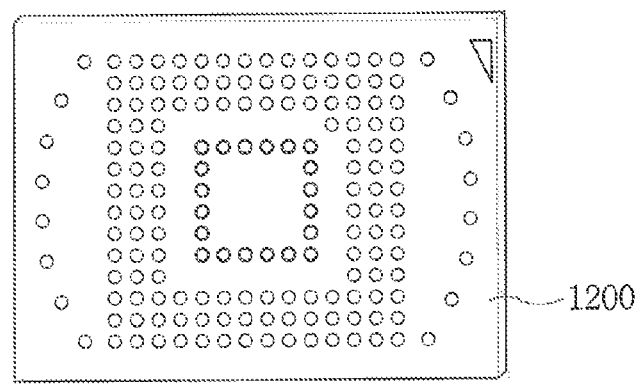
Figure 30:
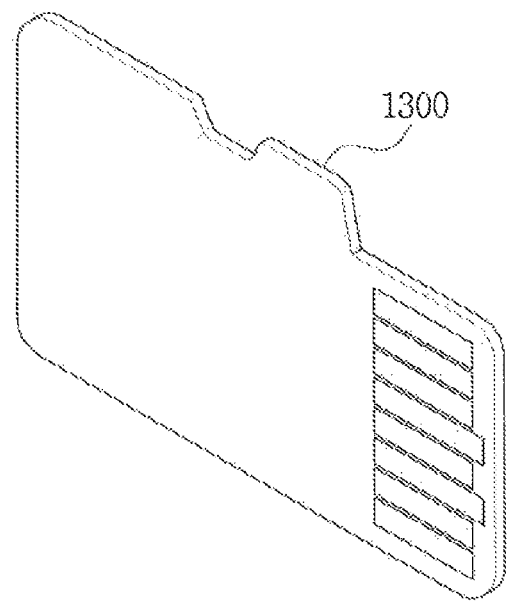
Figure 31:
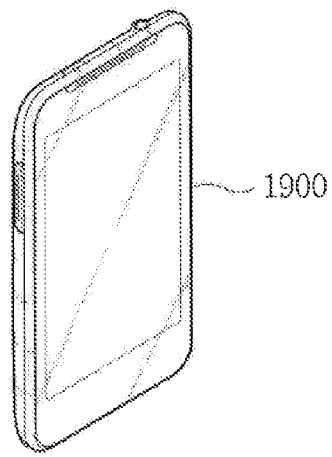
Figure 32:
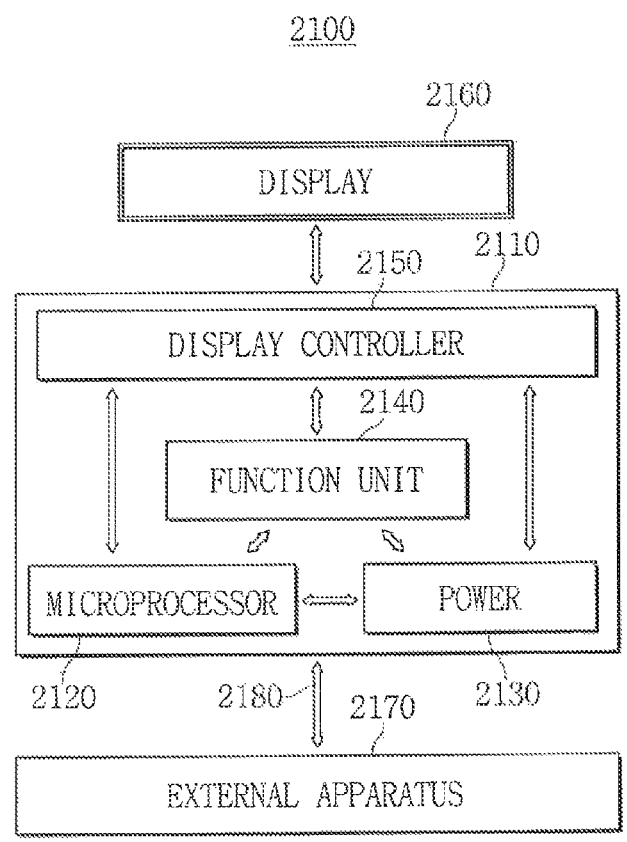

FIGS. 29 to 31 are perspective views illustrating electronic apparatuses in accordance with exemplary embodiments of the present inventive concept, and FIG. 32 is a system block diagram illustrating electronic apparatuses in accordance with exemplary embodiments of the present inventive concept.

Referring to FIGS. 29 to 31, the semiconductor device described with reference to FIGS. 1 to 26 may be applied to electronic systems, such as an embedded multi-media chip (eMMC) 1200, a micro SD 1300, a smart phone 1900, a netbook, a laptop computer, or a tablet PC. For example, the semiconductor device as described with reference to FIGS. 1 to 26 may be installed in a mainboard of the smart phone 1900. The semiconductor device as described with reference to FIGS. 1 to 26 may be provided to an expansion apparatus, such as the micro SD 1300, and be combined with the smart phone 1900.

Referring to FIG. 32, the semiconductor device as described with reference to FIGS. 1 to 26 may be applied to an electronic system 2100. The electronic system 2100 may include a body 2110, a microprocessor unit 2120, a power unit 2130, a function unit 2140, and a display controller unit 2150. The body 2110 may be a motherboard including a printed circuit board (PCB). The microprocessor unit 2120, the power unit 2130, the function unit 2140, and the display controller unit 2150 may be installed on the body 2110. A display unit 2160 may be disposed on the inside or outside of the body 2110. For example, the display unit 2160 may be disposed on a surface of the body 2110 and may display an image processed by the display controller unit 2150.

The power unit 2130 may receive a constant voltage from an external battery (not shown), etc., divide the voltage into various levels of voltages, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smart phone, the function unit 2140 may have several components which perform functions of a mobile phone, such as output of an image to the display unit 2160 or output of a voice to a speaker, by dialing or communication with an external apparatus 2170. If a camera is installed, the function unit 2140 may function as a camera image processor.

According to exemplary embodiments of the present inventive concept, when the electronic system 2100 is connected to a memory card, etc. in order to expand capacity, the function unit 2140 may include a memory card controller. The function unit 2140 may exchange signals with the external apparatus 2170 through a wired or wireless communication unit 2180. When the electronic system 2100 unit a universal serial bus (USB), etc. in order to expand functionality, the function unit 2140 may function as an interface controller. The function unit 2140 may include a mass storage apparatus.

The semiconductor device as described with reference to FIGS. 1 to 26 may be applied to the function unit 2140 or the microprocessor unit 2120.

According to exemplary embodiments of the present inventive concept, a lower plug (e.g., lower plug 61) formed in a lower part of an L-shaped contact hole 55, and an upper filling plug 63 formed on the lower plug (e.g., lower plug 61) may be provided. The lower plug may be formed using an SEG process. The upper filling plug 63 may be formed by performing a deposition process and an etching process alternately and repeatedly. The configuration of the lower plug (e.g., lower plug 61) and the upper filling plug may densely fill the contact hole 55 without a defect, such as a void or a seam. A semiconductor device having increased electrical properties may be formed.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A method of forming a semiconductor device, comprising:
    forming a semiconductor pattern on a substrate;
    forming an interlayer insulating layer on the semiconductor pattern;
    forming a contact hole in the interlayer insulating layer exposing the semiconductor pattern;
    forming a lower plug in the contact hole by a selective epitaxial growth (SEG) process; and
    forming an upper plug in the contact hole on the lower plug by alternately and repeatedly performing a deposition process and an etching process.

2. The method of claim 1, wherein the contact hole comprises:
    an upper contact hole having a height greater than a width thereof; and
    a lower contact hole connected to a lower part of the upper contact hole, wherein the lower contact hole exposes the semiconductor pattern, and
    wherein a center of the upper contact hole is offset from a center of the semiconductor pattern.

3. The method of claim 2, wherein the contact hole has an "L" shape.

4. The method of claim 2, wherein the lower contact hole has a width greater than a height thereof.

5. The method of claim 1, wherein the SEG process, the deposition process, and the etching process are performed in a same chamber by an in-situ process.

6. The method of claim 5, wherein the process conditions for the SEG process comprise:
    a low pressure ranging from about 5 mTorr to about 200 mTorr;
    a temperature of about 200° C. to about 600° C.;
    microwaves of about 1500 W to about 4000 W at about 1 GHz to about 10 GHz;
    a source gas including $SiH_4$, $SiH_2Cl_2$, or a combination thereof;
    a reactive gas including $H_2$, Ar, $Cl_2$, or a combination thereof; and
    a dopant gas including $PH_3$ or $B_2H_6$.

7. The method of claim 5, wherein the process conditions for the deposition process comprise:
    a low pressure ranging from about 5 mTorr to about 200 mTorr;
    a temperature of about 200° C. to about 600° C.;
    microwaves of about 1500 W to about 4000 W at about 1 GHz to about 10 GHz;
    an RF bias of about 100 W to about 300 W at about 5 MHz to about 500 MHz;
    a source gas including $SiH_4$, $SiH_2Cl_2$, or a combination thereof;
    a reactive gas including $H_2$, Ar, $Cl_2$, or a combination thereof; and
    a dopant gas including $PH_3$ or $B_2H_6$.

8. The method of claim 7, wherein the etching process includes an isotropic etching process or an etching process using the RF bias at a lower level than in the deposition process.

9. The method of claim 5 wherein the process conditions for the etching process comprise:
    a low pressure ranging from about 5 mTorr to about 200 mTorr;
    a temperature of about 200° C. to about 600° C.;
    microwaves of about 1500 W to about 4000 W at about 1 GHz to about 10 GHz; and
    an etching gas including $NF_3$, $Cl_2$, HCl, Ar, or a combination thereof.

10. The method of claim 1, wherein the etching process is performed before the deposition process.

11. The method of claim 10, wherein a lower end of the upper plug is formed at a lower level than an upper end of the lower plug, and
    the upper end of the lower plug protrudes up along an edge of the upper plug.

12. A method of forming a semiconductor device, comprising:
    forming a drain area on a substrate;
    forming an interlayer insulating layer on the drain area;
    forming a contact hole in the interlayer insulating layer exposing the drain area, wherein the contact hole includes an upper contact hole having a height greater than a width thereof, and a lower contact hole connected to a lower part of the upper contact hole,
    forming a selective epitaxial growth (SEG) plug in the lower contact hole using a selective epitaxial growth (SEG) process; and
    forming a polysilicon plug in contact hole on the SEG plug by performing a deposition process and an etching process alternately and repeatedly.

13. The method of claim 12, wherein a center of the polysilicon plug is offset from a center of the drain area.

14. The method of claim 12, further comprising a contact plug including the polysilicon plug and the SEG plug , wherein the contact plug has an "L" shape.

15. The method of claim 12, wherein a center of the SEG plug is offset from a center of the drain area, and the SEG plug has a width greater than a height.

* * * * *